United States Patent
Gooch et al.

(10) Patent No.: US 6,521,477 B1
(45) Date of Patent: Feb. 18, 2003

(54) VACUUM PACKAGE FABRICATION OF INTEGRATED CIRCUIT COMPONENTS

(75) Inventors: Roland W. Gooch, Dallas, TX (US); Thomas R. Schimert, Ovilla, TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/496,820

(22) Filed: Feb. 2, 2000

(51) Int. Cl.[7] .................. H01L 21/44; H01L 21/00; H01L 21/48; H01L 21/76

(52) U.S. Cl. .................. 438/106; 438/50; 438/51; 438/113; 438/401; 438/909

(58) Field of Search .................. 438/51, 401, 909, 438/113, 106, 50

(56) References Cited

U.S. PATENT DOCUMENTS

| | | | |
|---|---|---|---|
| 4,169,273 A | 9/1979 | Hendrickson | 358/213 |
| 4,291,815 A | 9/1981 | Gordon et al. | 220/200 |
| 4,352,449 A | 10/1982 | Hall et al. | 228/123 |
| 4,654,622 A | 3/1987 | Foss et al. | 338/14 |
| 4,701,424 A | 10/1987 | Mikkor | 437/209 |
| 4,752,694 A | 6/1988 | Hegel, Jr. et al. | 250/378 |
| 5,010,251 A | 4/1991 | Grinberg et al. | 250/332 |
| 5,021,663 A | 6/1991 | Hornbeck | 250/349 |
| 5,082,162 A | 1/1992 | Kamiyama et al. | 228/123 |
| 5,196,377 A | 3/1993 | Wagner et al. | 437/225 |
| 5,220,188 A | 6/1993 | Higashi et al. | 257/467 |
| 5,260,225 A | 11/1993 | Liu et al. | 437/3 |
| 5,286,671 A | 2/1994 | Kurtz et al. | 437/64 |

(List continued on next page.)

FOREIGN PATENT DOCUMENTS

| | | | | |
|---|---|---|---|---|
| EP | 0828346 | 3/1998 | | H03H/9/05 |
| EP | 0951069 | 10/1999 | | H01L/23/10 |
| FR | 2780200 | 12/1999 | | H01L/23/10 |
| FR | WO 99/67818 | 12/1999 | | H01L/21/50 |
| WO | WO 99/50905 | 10/1999 | | H01L/23/10 |

OTHER PUBLICATIONS

Tissot, Jean–Luc, et al, Abstract: LETI/LIR's Amorphous Silicon Uncooled Microbolometer Development, Part of the SPIE Conference on Infrared Detectors and Focal Plane Arrays V, Orlando, Florida, SPIE vol. 3379, Apr. 1998, pp. 139–144.

*Primary Examiner*—Matthew Smith
*Assistant Examiner*—Chuong A Luu
(74) *Attorney, Agent, or Firm*—Baker Botts L.L.P.

(57) ABSTRACT

A method for vacuum packaging MEMS or similar devices during device fabrication comprises forming a plurality of MEMS devices (12), or similar devices, on a device wafer (10). A device sealing ring (16) is formed between the MEMS devices (12) and bonding pads (14) connected to a MEMS device. A solder adhesion layer (24) forms part of the device sealing ring (16) surrounding each MEMS or similar device (12). A lid wafer (30) is formed having a plurality of lid sealing rings (32) corresponding in number and location to the device sealing rings (16). Each lid sealing ring (32) surrounds a cavity (34). The device wafer (30) is aligned with the lid wafer (10) to align each device sealing ring (16) with the corresponding lid sealing ring (32), leaving a gap between the lid wafer (30) and the device wafer (10). The resulting assembly (50) is placed in a vacuum furnace. The vacuum furnace is evacuated and heated to a temperature sufficient to allow outgassing of all surface areas of the lid wafer (30) and the device (10). The device wafer (30) is brought into contact with the lid wafer (10) thereby creating a vacuum package over each MEMS device (12). The assembly (50) is cooled at a rate sufficient to minimize subsequent outgassing of the surfaces while minimizing thermal stresses upon the vacuum package. After the assembly (50) is cooled, each vacuum packaged MEMS device (12) is tested, and the assembly (50) is then diced into individual vacuum packaged MEMS devices (12).

31 Claims, 6 Drawing Sheets

U.S. PATENT DOCUMENTS

| | | | |
|---|---|---|---|
| 5,286,976 A | 2/1994 | Cole | 250/349 |
| 5,288,649 A | 2/1994 | Keenan | 437/3 |
| 5,300,915 A | 4/1994 | Higashi et al. | 338/22 R |
| 5,367,167 A | 11/1994 | Keenan | 250/338.4 |
| 5,367,194 A | 11/1994 | Beatty | 257/727 |
| 5,431,328 A | 7/1995 | Chang et al. | 228/180.22 |
| 5,449,910 A | 9/1995 | Wood et al. | 250/338.1 |
| 5,450,053 A | 9/1995 | Wood | 338/18 |
| 5,512,748 A | 4/1996 | Hanson | 250/332 |
| 5,534,111 A | 7/1996 | Hocker et al. | 216/15 |
| 5,573,859 A | 11/1996 | Suppelsa | 428/553 |
| 5,605,489 A | 2/1997 | Gale et al. | 451/28 |
| 5,021,663 A | 7/1997 | Hornbeck | 250/349 |
| 5,659,195 A | 8/1997 | Kaiser et al. | 257/415 |
| 5,701,008 A | 12/1997 | Ray et al. | 250/352 |
| 5,726,480 A * | 3/1998 | Pister | 257/415 |
| 5,773,987 A | 6/1998 | Montoya | 324/757 |
| 5,777,328 A | 7/1998 | Gooch | 250/338.4 |
| 5,789,753 A | 8/1998 | Gooch et al. | 250/349 |
| 5,895,233 A | 4/1999 | Higashi et al. | 438/107 |
| 5,905,007 A * | 5/1999 | Ho et al. | 430/22 |
| 5,915,168 A | 6/1999 | Salatino et al. | 438/110 |
| 5,919,548 A * | 7/1999 | Barron et al. | 428/138 |
| 5,921,461 A | 7/1999 | Kennedy et al. | 228/124.6 |
| 5,923,995 A * | 7/1999 | Kao et al. | 438/460 |
| 5,929,441 A | 7/1999 | Beratan et al. | 250/338.3 |
| 5,970,315 A * | 11/1999 | Carley et al. | 438/52 |
| 6,028,312 A | 2/2000 | Wadsworth et al. | 250/351 |
| 6,036,872 A | 3/2000 | Wood et al. | 216/2 |
| 6,046,067 A * | 4/2000 | Werner | 438/52 |
| 6,054,745 A * | 4/2000 | Nakos et al. | 257/415 |
| 6,062,461 A | 5/2000 | Sparks et al. | 228/123.1 |
| 6,064,216 A | 5/2000 | Farnworth et al. | 324/755 |
| 6,087,199 A * | 7/2000 | Pogge et al. | 438/106 |
| 6,119,920 A | 9/2000 | Guthrie et al. | 228/123.1 |
| 6,143,997 A * | 11/2000 | Feng et al. | 200/181 |
| 6,159,812 A | 12/2000 | Cheek et al. | 438/303 |
| 6,210,988 B1 * | 4/2001 | Howe et al. | 438/50 |
| 6,232,150 B1 | 5/2001 | Lin et al. | 438/119 |

* cited by examiner

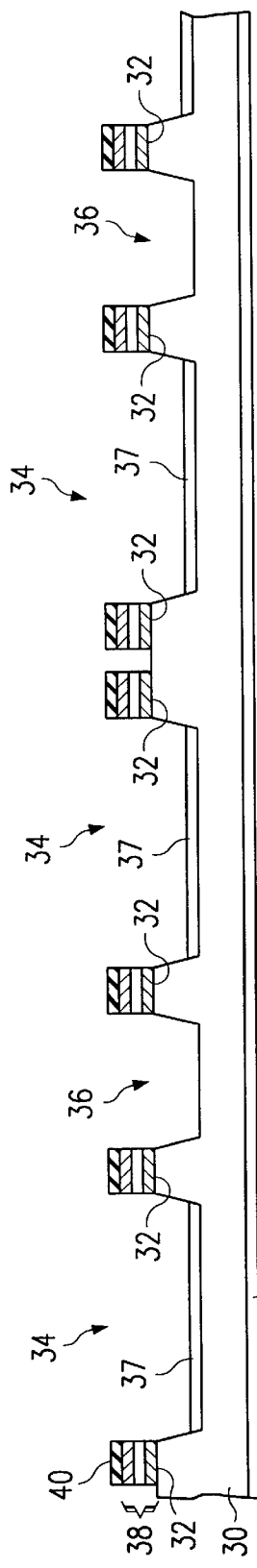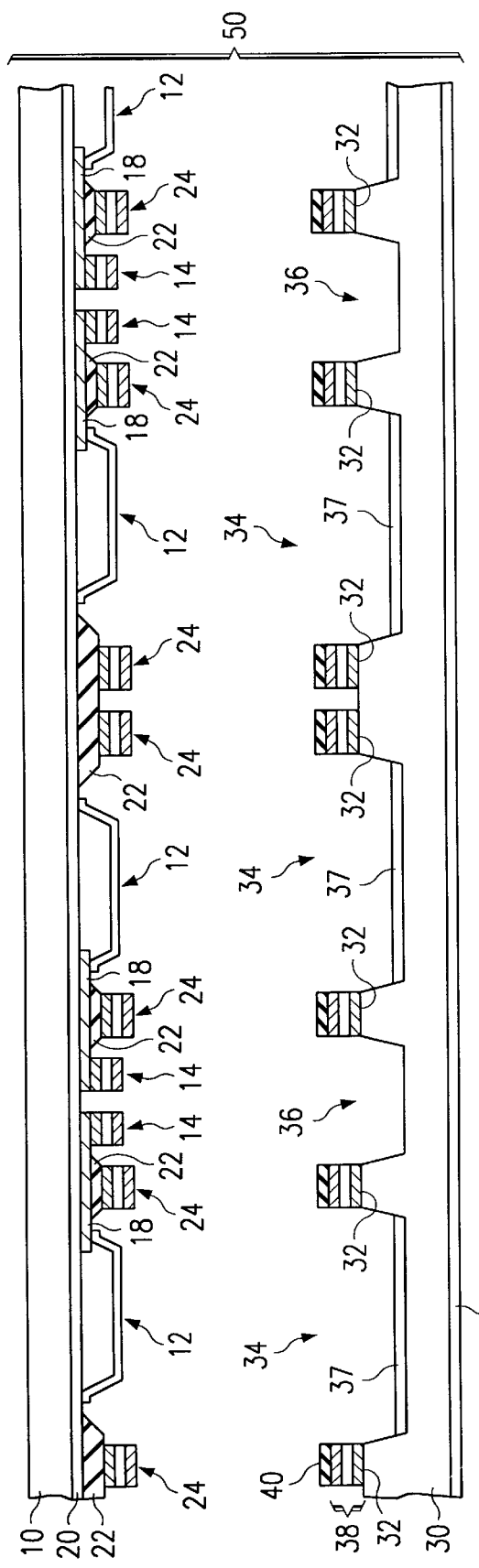

VACUUM PACKAGE FABRICATION OF INTEGRATED CIRCUIT COMPONENTS

This invention was made under Government Contract No. F30602-97-C-0127. The government has certain rights in this invention.

TECHNICAL FIELD OF THE INVENTION

This invention relates to integrated circuit fabrication, and more particularly, to a method for vacuum packaging integrated circuit components, or similar devices, during fabrication.

BACKGROUND OF THE INVENTION

Microelectromechanical systems (MEMS) are integrated micro devices or systems combining electrical and mechanical components. MEMS devices are fabricated using standard integrated circuit batch processing techniques. MEMS devices are used in many ways including sensing, controlling, and actuating on the micro scale. MEMS devices function individually or in arrays to generate effects on a macro scale.

Many MEMS devices require a vacuum environment in order to attain maximum performance. The vacuum package also provides protection and an optimal operating environment for the MEMS device. Examples of these MEMS devices are infrared MEMS such as bolometers and certain inertial MEMS such as gyros and accelerometers. Currently MEMS devices are individually packaged in vacuum compatible packages after fabrication and dicing of the MEMS device. Often, packaging costs of MEMS devices is 10 to 100 times the fabrication costs. These high packaging costs make it difficult to develop commercially viable vacuum packaged MEMS devices.

MEMS devices are fragile especially after dicing. Care must be taken in handling these devices, and traditional integrated circuit fabrication machinery cannot adequately handle and protect MEMS devices. Therefore, special handling techniques have been developed to protect the MEMS devices until vacuum packaging has been completed. These special handling procedures add additional cost to the production of MEMS devices.

SUMMARY OF THE INVENTION

From the foregoing, a need has arisen for an improved method for vacuum packaging MEMS or similar devices during fabrication. In accordance with the present invention, an improved method for vacuum packaging MEMS or similar devices during fabrication is provided to substantially reduce disadvantages or problems associated with traditional methods of vacuum packaging MEMS or similar devices.

According to one embodiment of the present invention, there is provided a method for vacuum packaging MEMS devices during fabrication that comprises forming a plurality of MEMS devices on a device silicon wafer with each MEMS device surrounded by one of a plurality of dielectric layer rings between the perimeter of the MEMS device and any associated bonding pads. A first sealing ring is next formed on each of the plurality of dielectric layer rings. A lid wafer is formed having a plurality of second sealing rings corresponding to the plurality of first sealing rings and each of the second sealing rings surrounding a cavity in the lid wafer. Next, a sealing layer is formed on either each of the plurality of first sealing rings or each of the plurality of second sealing rings to allow eventual mating of the device wafer and the lid wafer.

The device wafer is aligned with the lid wafer such that one of the plurality of first sealing rings is aligned over one of the plurality of second sealing rings. The sealing rings of the device wafer and lid wafer are not brought into contact at this point, rather a gap is left to allow gases to escape. The device wafer and lid wafer assembly is placed in a vacuum furnace which is evacuated and heated to a temperature sufficient to allow outgassing of all surface areas. After all surface areas are outgassed, the gap between the device wafer and lid wafer is closed causing one of the plurality of first sealing rings to make contact with one of the plurality of second sealing rings thereby creating a vacuum package enclosing each MEMS device on the device wafer. Next, the assembly is cooled at a maximum rate in order to minimize subsequent outgassing of surfaces within the vacuum areas of the assembly while at the same time preventing thermal stresses on the assembly.

The present invention provides various advantages over traditional vacuum packaging methods. One technical advantage of the present invention is that vacuum packaging is incorporated into the fabrication process of MEMS devices. Another technical advantage is the elimination of individual MEMS vacuum packaging and individual die handling. Yet another advantage of the present invention is that all MEMS devices on a silicon wafer are vacuum packaged at one time during device fabrication, thereby significantly reducing the costs associated with vacuum packaging MEMS devices. This reduction in costs should result in the development of commercially viable MEMS devices. Yet another advantage of the present invention is that MEMS devices are protected at an earlier stage in fabrication. Another advantage is the ability to use traditional methods of handling integrated circuits after a MEMS device is vacuum packaged and diced. Still another advantage of the present invention is the ability to test all MEMS devices after vacuum packaging but before dicing using traditional integrated circuit testing procedures. Other advantages may be readily ascertainable by those skilled in the art.

BRIEF DESCRIPTION OF THE DRAWINGS

For a more complete understanding of the present invention and the advantages thereof, reference is now made to the following description taken in conjunction with the accompanying drawings:

FIG. 6 is a cross section of the silicon lid wafer of FIG. 5;

FIG. 7 is a cross section of the lid wafer and the device wafer illustrating the mating process which results in vacuum packaged MEMS devices;

DETAILED DESCRIPTION OF THE INVENTION

Infrared microelectromechanical systems (MEMS) devices and certain other inertial MEMS devices require a vacuum environment to attain maximum performance. For example, infrared microbolometers require an operating pressure of less than 10 millitorr to minimize thermal transfer from the detector elements to the substrate and package walls. Thus, vacuum compatible materials processes and equipment must be used. Infrared devices also require an optically transparent cover. These packaging requirements translate to high labor and capital expense and present a significant cost barrier to commercially viable MEMS devices. MEMS device packaging costs are usually ten to one hundred times the basic device fabrication cost even in reasonably high volume.

The solution to high packaging costs is to eliminate the traditional individual vacuum packaging of a completed die. In accordance with the present invention, this is achieved by moving the packaging step into the wafer fabrication area. A lid wafer is aligned and mounted to the device wafer with an annular seal ring of solder, or other sealing material, forming an enclosed cell at each die location. This lid attachment process is completed in a vacuum environment, leaving each MEMS device in a vacuum cell. Interconnects are brought out under the solder seal ring and are isolated by a dielectric layer.

Figure 1:
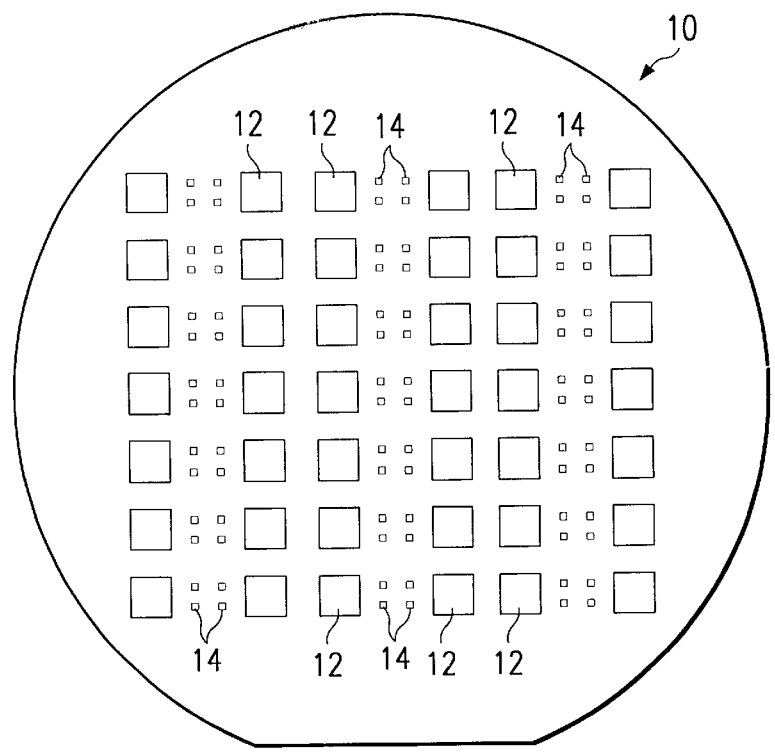
FIG. 1 is a top view of a silicon wafer having MEMS devices formed thereon.

Referring to FIG. 1, a silicon device wafer is generally indicated at 10. Silicon device wafer 10 is a standard substrate used for fabrication of integrated circuit devices, MEMS devices or similar devices. However, any suitable substrate material may be used. For example, a substrate material with integrated circuit readout devices embedded therein may be used as device wafer 10. Silicon device wafers usually have many MEMS devices 12 formed thereon using traditional methods of integrated circuit fabrication. Although the present embodiment of the invention is discussed in terms of vacuum packaging for MEMS devices, the method may be used for vacuum packaging of any integrated circuit device, or similar device, formed on a substrate material and contained within a vacuum package. Each MEMS device 12 usually has one or more associated bonding pads 14. Bonding pads 14 provide the electrical connections to MEMS device 12. In FIG. 1, each MEMS device 12 has two associated bonding pads 14. Although the present embodiment is discussed in terms of having bonding pads on one side of MEMS device 12, the bonding pads could exist on one or more sides of MEMS device 12 depending upon the specific application for, and design of, MEMS device 12. As stated above, MEMS device 12 could be a MEMS device or other micro-device formed on a suitable substrate and benefitting from a vacuum package.

The term micro-device is used herein to refer to these devices including integrated circuit devices, MEMS devices, or similar devices.

Figure 2:
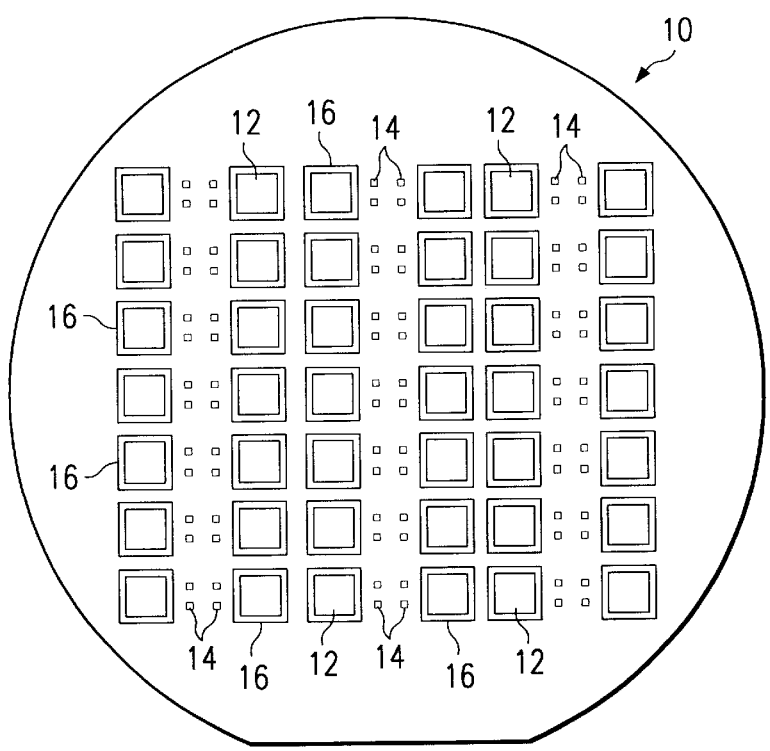
FIG. 2 is a top view of the silicon wafer of FIG. 1 illustrating a sealing ring surrounding each MEMS device on the wafer.

Referring to FIG. 2, device wafer 10 is illustrated having MEMS devices 12 and associated bonding pads 14. In order to create an individual vacuum package over each MEMS device 12 on device wafer 10, sufficient area must be left in order to place a sealing ring 16 around each MEMS device 12. Sealing ring 16 defines the vacuum package around a MEMS device 12. Although the present embodiment is discussed in terms of one MEMS device 12, or microdevice, per vacuum package, or vacuum cell, one or more micro-devices may be enclosed in a vacuum cell depending on the requirements, function, and design of the resulting device.

Figure 3:
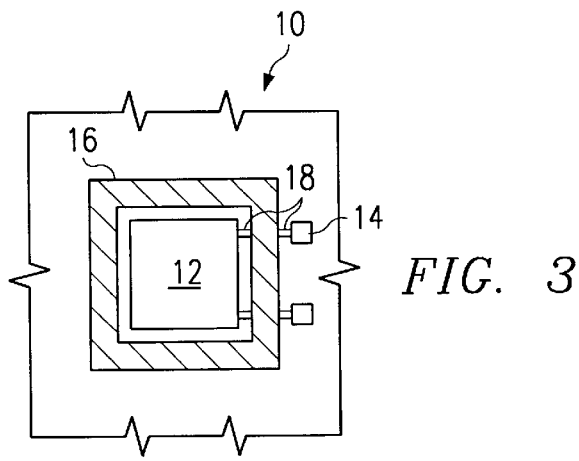
FIG. 3 is a top view of a single MEMS device illustrating the MEMS device, associated bonding pads, and the surrounding sealing ring.

Referring to FIG. 3, a single MEMS device 12 is illustrated to more completely show the layout on device wafer 10. A lead 18 connects each bonding pad 14 to MEMS device 12. A space is left between MEMS device 12 and bonding pad 14 to form the device sealing ring 16. Note that lead 18 runs beneath fabrication layers to be built within device sealing ring 16. Since the device sealing ring 16 defines the area of the device wafer 10 within which a vacuum package will be formed, electrical connections are made to bonding pads 14 without affecting the vacuum seal existing around MEMS device 12.

Figure 4:
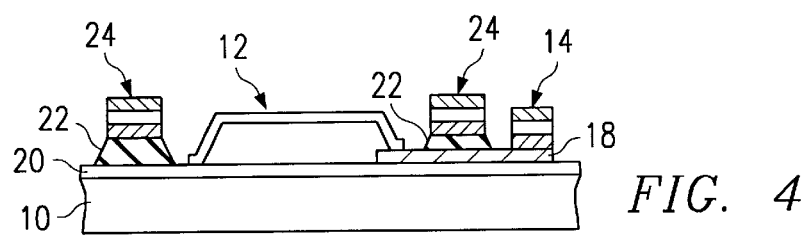
FIG. 4 is a cross section of a single MEMS device illustrating the various layers of the MEMS device.

Referring to FIG. 4, there is illustrated an example of a single MEMS device 12 ready to be enclosed within a vacuum package. Device wafer 10 includes a layer of silicon dioxide 20 deposited or grown upon the surface thereof prior to fabrication of MEMS device 12. A lead 18 on a side of the MEMS device 12 enables coupling to the bonding pads 14. Although the present embodiment is illustrated with leads on one side of MEMS device 12, leads 18 could exist on one or more sides of MEMS device 12. Sufficient space is provided between MEMS device 12 and bonding pads 14 to allow fabrication of sealing layers for the device sealing ring 16.

Bonding pad 14 may be comprised of any suitable metal or metals for making subsequent electrical connections. In one embodiment, the bonding pad 14 is comprised of a first layer of titanium, a second layer of palladium, and a final layer of gold. Since bonding pad 14 is deposited on lead 18, the solder base layer 24 may be used for bonding pad 14. Bonding pads also may be fabricated along with the MEMS device 12 and are discussed here only for completeness. Bonding pads are not necessarily part of the vacuum packaging process but are required if lead metal 18 is too thin for wire bonding.

Although the following will describe the formation of a sealing ring 16 surrounding a single MEMS device 12, all MEMS devices on device wafer 10 have sealing rings formed simultaneously. A dielectric layer 22 is formed as the first step of fabricating a device sealing ring 16 (not expressly shown) using integrated circuit fabrication techniques. Preferably, the dielectric layer 22 is composed of silicon nitride although any suitable dielectric may be used. Dielectric layer 22 provides electrical isolation for leads 18.

A solder adhesion surface 24 is fabricated on the dielectric layer 22 as the next step in completing the device sealing ring 16. Solder adhesion surface 24 is illustrated to be comprised of a first layer of titanium, a middle layer of palladium, and a third layer of gold. However, there are many suitable metals or combination of metals available for use in fabricating the solder adhesion surface 24. Solder adhesion surface 24 may be deposited at the same time as bonding pads 14. Although device sealing ring 16 has been described as utilizing a heat activated solder, a compression seal, such as an indium compression seal, may be used. If a compression seal is used, then solder adhesion surface 24 is not formed on top of the dielectric layer 22. At this point, preparation of the sealing ring 16 on the device wafer 10 is complete. Every MEMS device 12 upon device wafer 10 now has a sealing ring 16 prepared to receive a heat activated solder sealed vacuum package lid.

Figure 5:
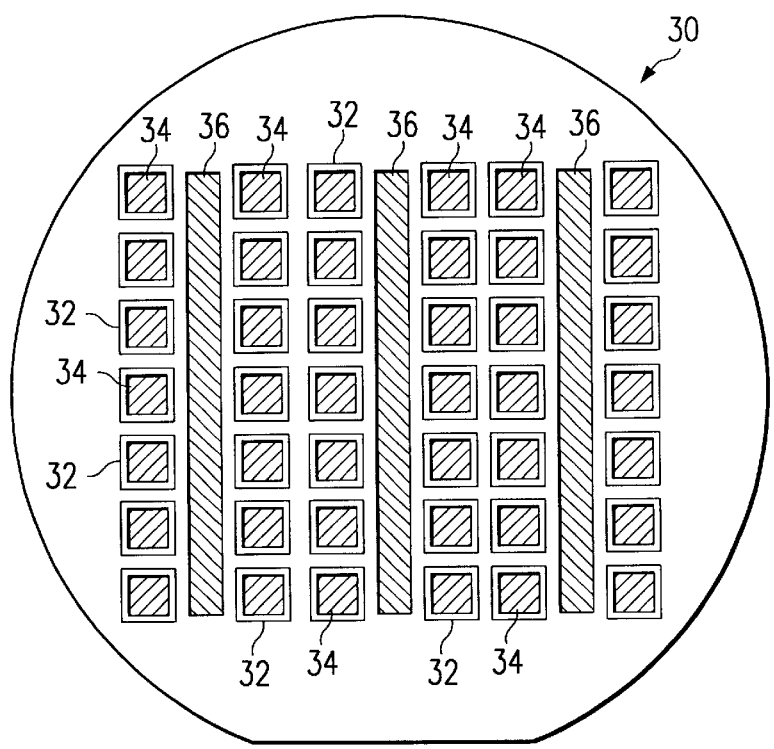
FIG. 5 is a top view of the patterned side of a silicon lid wafer.

Referring to FIG. 5, there is illustrated a silicon lid wafer 30. Although the preferred embodiment utilizes a silicon wafer as a substrate for the lid wafer 30, any suitable substrate material may be used. Lid wafer 30 includes a plurality of lid sealing rings 32 corresponding in number to device sealing rings 16 on device wafer 10. Each of the lid sealing rings 32 is a mirror image of a device sealing ring 16 so that lid wafer 30 mates with device wafer 10. Cavities 34 and bonding pad channels 36 are etched in the lid wafer 30 using an appropriate process such as wet or dry etching. The etching process for cavities 34 and bonding pad channels 36 may include depositing a layer of silicon nitride and patterning the silicon nitride layer to form an appropriate etch mask. An orientation dependent etch, or other suitable process, is then used to form cavities 34 and bonding pad channels 36. The silicon nitride layer may be removed before depositing the seal rings 32. Each of the cavities 34 is surrounded by a lid sealing ring 32. The function of the cavities 34 is to provide increased volume for a vacuum packaged MEMS device 12. As discussed below, the increased volume for the vacuum packaged MEMS device 12 provides for a higher vacuum level within the vacuum cell. Cavities 34 may be optional in some embodiments of the present invention that do not require a high vacuum. The function of the bonding pad channel 36 is to provide clearance over bonding pads 14 so that a dicing saw, etching process, or other suitable process may be used in a later step to open the lid wafer to expose the bonding pads for device testing before dicing of the wafer.

Referring to FIG. 6, there is illustrated a cross section of a portion of lid wafer 30. Lid sealing rings 32 are fabricated on the lid wafer 30 to mate with device sealing rings 16 on the device wafer 10. An etching process, or other suitable process, is used to etch the surface of lid wafer 30 creating cavities 34 and bonding pad channels 36. The etching process creates a cavity 34 on lid wafer 30 corresponding to each MEMS device 12 on device wafer 10 and a bonding pad channel 36 in lid wafer 30 corresponding to each row of bonding pads 14 on device wafer 10.

An alternate process of patterning the lid wafer 30 includes forming a window wafer which is then bonded to the lid wafer. The window wafer may be formed by completely etching cavities 34 and bonding pad channels 36 through a wafer that is then bonded to an unetched lid wafer 30. This process provides smooth surfaces within cavities 34 and bonding pad channels 36 when bonded to the lid wafer 30.

Another alternate process of patterning lid wafer 30 includes etching the entire surface of the lid wafer leaving lid sealing rings 32 raised above the surface. The complete surface of lid wafer 30 except lid sealing rings 32 would be etched to a predetermined depth.

An optical coating may be necessary on the surface of the lid wafer 30 for optimal performance of MEMS device 12. If MEMS device 12 is an infrared detector or other optical device, an anti-reflective coating 35 is applied to the outer surface of lid wafer 30. In addition, the cavities 34 in lid wafer 30 may be coated with an anti-reflective coating 37.

Cavities 34 represent areas of the lid wafer 30 directly above MEMS device 12 when fabrication is complete thus creating a package for MEMS device 12. Cavities 34 may be on the order of 0.5 to 0.75 millimeter deep. By etching cavities in the lid wafer 30 corresponding to the area above the individual MEMS devices 12, a smaller surface to volume ratio is obtained for the interior of the individual packages created by the mating of lid wafer 30 with device wafer 10. This smaller surface to volume ratio results in a lower internal pressure within a vacuum packaged MEMS device 12. Since pressure is proportional to the number of molecules per unit of volume, for a given number of molecules, increasing the volume necessarily reduces the pressure.

After the lid wafer 30 has been formed, a solder adhesion surface 38 is deposited to form lid sealing rings 32. As previously noted, solder adhesion surface 38 is not needed if an attachment method is used other than heat activated solder. In the preferred embodiment, heat activated solder is used and, therefore, lid solder adhesion surface 38 is deposited to form lid sealing rings 32. Lid solder adhesion surface 38 is comprised of any combination of metal or metal alloys that will provide a surface wettable by the solder, and a secure attachment to device wafer 10. Preferably, the lid solder adhesion surface 38 is comprised of a first layer of titanium, followed by a middle layer of palladium, and an outer layer of gold.

A solder layer 40 is deposited on lid solder adhesion surface 38. If a sealing method other than heat activated solder is used, the solder layer 40 is replaced by a material necessary to obtain a vacuum tight seal. In an alternative embodiment, an indium compression seal is used. However, in the preferred embodiment, a heat activated solder layer 40 is used. Solder layer 40 may be deposited through traditional integrated circuit fabrication techniques or other suitable deposition processes. For example, lid wafer 30 is electroplated resulting in solder layer 40 being deposited upon lid solder adhesion surface 38. Another method of depositing solder layer 40 includes using electroless plating. Another method of depositing solder layer 40 includes using vacuum deposition. Yet another method of depositing solder layer 40 includes using a preformed, prepunched solder layer which is aligned over lid solder adhesion surfaces 38 and attached thereto. Any suitable method of attachment may be used including spot welding the preformed, prepunched solder layer to lid solder adhesion surfaces 38. In yet another method of depositing solder layer 40, a solder ball method could be used to deposit solder layer 40. The solder ball method includes creating a template with a plurality of discrete holes where solder would be deposited. The template, with solder balls in the holes, is then aligned and placed on lid wafer 30. The solder balls are then released from the template and attached to lid solder adhesion surfaces 38. When lid wafer 30 is heated to an appropriate level, the solder balls would melt and form a continuous solder layer 40. Solder layer 40 may be comprised of any appropriate material such as an indium compression seal, indium solder, metal solder, metal alloy solder, or solder balls. Although the preferred embodiment deposits solder layer 40 on lid solder adhesion surface 38, solder layer 40 could also be deposited on solder adhesion surface 24 on device wafer 10.

Referring to FIG. 7, there is illustrated an assembly 50 including device wafer 10 and lid wafer 30 ready for final assembly before placement in a vacuum furnace (not expressly shown). To prepare the assembly 50 for placement in a vacuum furnace, the lid wafer 30 is placed in an assembly holder (not expressly shown) with the solder layer 40 facing up. Device wafer 10 is aligned over lid wafer 30 such that device sealing rings 16 are aligned over the corresponding lid sealing rings 32. If solder layer 40 is deposited on solder adhesion surface 24 on device wafer 10, the device wafer is placed in an assembly holder with the solder layer 40 facing up, and the lid wafer 30 is aligned over device wafer 10. Lid wafer 30 and device wafer 10 are held in alignment with a gap to allow outgassing of all surface areas. The gap may be on the order of two millimeters. Assembly 50 thus includes lid wafer 30 and device wafer 10 aligned in an assembly holder with a gap to allow outgassing. The gap provides for a more complete evacuation of each vacuum cell and, thus, a higher vacuum level in the resulting vacuum packaged MEMS devices 12.

Assembly 50 is placed in a vacuum furnace. The vacuum furnace is evacuated to a minimum pressure level on the order of $2 \times 10^{-7}$ torr. The vacuum furnace is then heated to a level just below the melting point of the solder layer 40. For example, if the melting point of the solder layer 40 is 280° C., the vacuum furnace is heated to approximately 275° C. The vacuum furnace temperature is dependent upon the melting point of solder layer 40. Assembly 50 is held in the vacuum furnace for a period sufficient to allow outgassing of all surfaces. This period may be on the order of several hours. The holding period is determined by the final vacuum pressure required within the vacuum packaged MEMS device.

After outgassing of all surfaces is complete, the vacuum furnace temperature is raised to the melting point of solder layer 40. When the solder layer 40 melts, a short period of time is allowed for outgassing of the solder and then device wafer 10 is brought into contact with lid wafer 30 creating a vacuum seal between lid sealing rings 32 and device sealing rings 16. Thus, all MEMS devices 12 on device wafer 10 are now enclosed within a vacuum package.

If sealing layer 40 is not heat activated, a vacuum chamber may be used in place of a vacuum furnace to provide the appropriate vacuum environment. In that situation, melting of solder layer 40 would not be necessary. An application of force may then be used to seal the device wafer 10 with the lid wafer 30.

Figure 8:
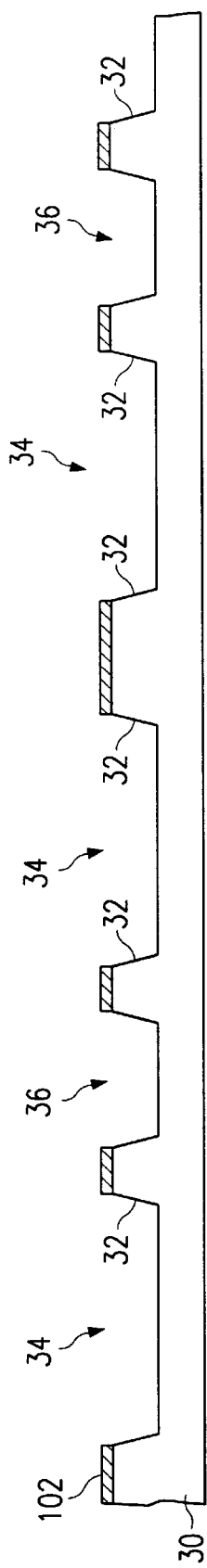
FIG. 8 is a cross section of the lid wafer prior to formation of spacers on each of the lid sealing rings.
Figure 9:
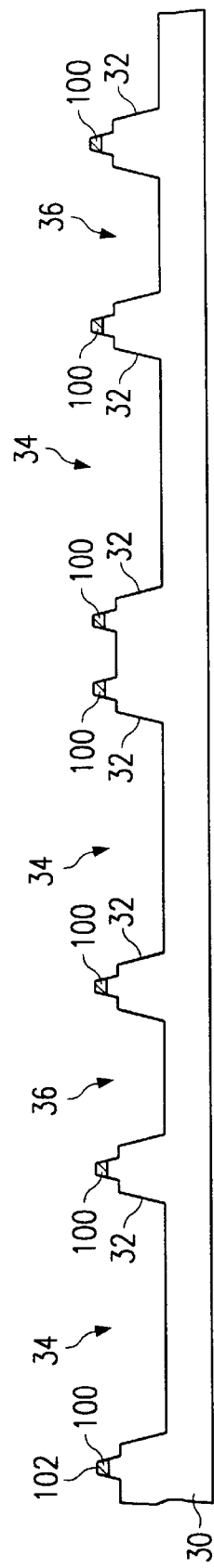
FIG. 9 is a cross section of a lid wafer after formation of the spacers on each of the lid sealing rings.
Figure 10:
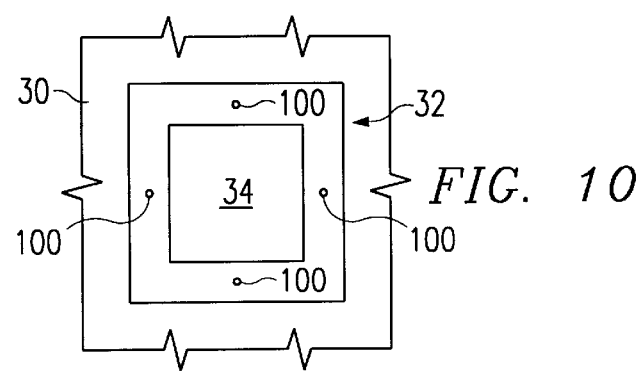
FIG. 10 is a schematic diagram of a portion of the lid wafer with a lid sealing ring and spacers formed thereon.

When device wafer 10 is brought into contact with lid wafer 30, a non-uniform thickness of solder layer 40 may result. A non-uniform solder thickness could result in significant losses of vacuum packaged MEMS devices 12 due to breaches in solder layer 40 resulting in loss of vacuum within the vacuum cell. FIGS. 8, 9, and 10 illustrate solder thickness control for maintaining a uniform solder thickness for all MEMS devices 12 on assembly 50. By maintaining a uniform solder thickness, proper vacuum seals and adequate vacuums will exist for each vacuum packaged MEMS device 12 on device wafer 10.

Referring to FIG. 8, there is illustrated the lid wafer 30 after cavities 34 and bonding pad channels 36 have been etched leaving lid sealing rings 32 surrounding each cavity 34. As previously discussed, prior to etching of cavities 34 and bonding pad channels 36, a layer of silicon nitride 102 is deposited on the surface of lid wafer 30 and patterned to form an etch mask. An orientation dependent etch, or other suitable process, is used to form cavities 34 and bonding pad channels 36 resulting in the configuration of lid wafer 30 shown in FIG. 8.

Referring to FIG. 9, there is illustrated the lid wafer 30 having spacers 100 formed on the lid sealing rings 32. Silicon nitride layer 102 is patterned and etched using any suitable etching process to form small islands of material defining the spacers 100. The small islands of silicon nitride 102 may be on the order of 20 microns in diameter. The number of islands of silicon nitride 102 formed on lid sealing rings 32 is determined to insure a minimum thickness of the solder layer 40 on all lid sealing rings 32. Lid wafer 30 is then exposed to an orientation dependent etch, or any other suitable patterning technique, to form spacers 100 on lid sealing rings 32. The nitride on top of each spacer 100 may remain. However, the nitride layer may be removed if necessary.

Referring to FIG. 10, there is illustrated a portion of lid wafer 30 after it has been patterned and etched to form cavities 34, lid sealing rings 32 and spacers 100. Cavity 34 is the deepest etched area on lid wafer 30. Above and surrounding cavity 34 is the lid sealing ring 32. On the top of lid sealing ring 32 are the spacers 100. The spacers 100 are intended to insure that a uniform thickness of solder will exist on lid sealing ring 32 after lid wafer 30 and device wafer 10 are mated. After spacers 100 have been formed on lid wafer 30, lid sealing rings 32 are prepared with a solder adhesion surface 38 and solder layer 40 as discussed with reference to FIG. 6 and FIG. 7. Spacers 100 are placed in lid sealing ring 32 to produce a uniform thickness of solder. Spacers 100 may be on the order of 5 to 20 microns high. Any suitable process may be used to form spacers 100 including attaching a small dot of material, such as silicon, to the surface of lid sealing ring 32 rather than etching the surface of lid sealing ring 32. Although the process of forming spacers 100 has been discussed in relation to vacuum packaging of MEMS devices 12, spacers 100 may be incorporated into any wafer level packaging process where a lid wafer is mated with a device wafer, regardless of the underlying components or devices.

When the heated assembly 50 cools, there is still a subsequent outgassing of the surfaces thereby raising the pressure level within the vacuum packaged MEMS device 12. In order to minimize subsequent outgassing of surfaces within vacuum packaged MEMS devices 12, assembly 50 is cooled at a rate to minimize subsequent outgassing of the surfaces while minimizing the potential of thermal stresses upon assembly 50. Thermal stresses could result in cracks thereby compromising the integrity of the vacuum package. By quickly cooling assembly 50, the desired vacuum (lowest) pressure level within vacuum packaged MEMS devices 12 is achieved. In addition, as previously discussed, cavities 34 decrease the surface to volume ratio inside vacuum packaged MEMS device 12 resulting in decreased pressure. Cavities 34 make the vacuum packaged MEMS device 12 more tolerant to subsequent outgassing of surfaces within the package. In accordance with the present invention, pressure levels as low as 5 millitorr have been achieved although lower pressure levels are possible. By minimizing the vacuum pressure, performance of certain MEMS devices is maximized. For instance, infrared microbolometers require an operating pressure of less than 10 millitorr to minimize thermal transfer from the detector elements to the substrate or package walls.

Figure 11:
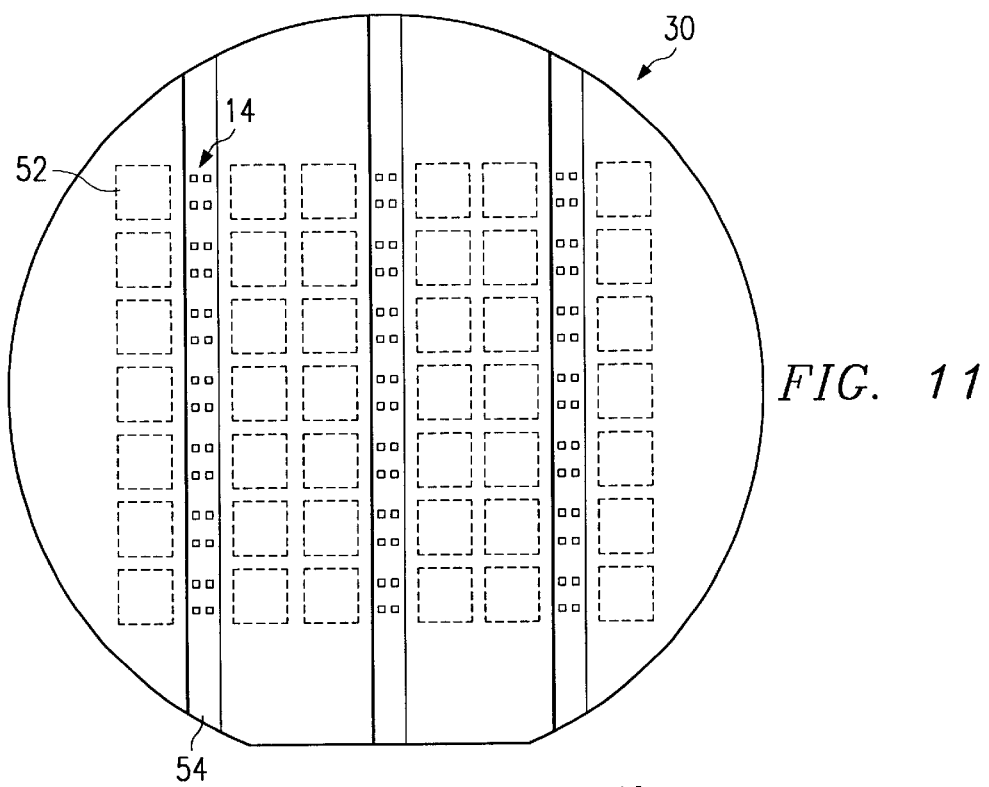
FIG. 11 is a top view of the complete device wafer and lid wafer assembly after removal of the lid wafer area to expose bonding pads for testing devices in the wafer assembly.

Referring to FIG. 11, probe channels 54 are formed in lid wafer 30 by removing the lid wafer 30 over bonding pad channel 36. After probe channels 54 have been formed in lid wafer 30, bonding pads 14 are accessible through the probe channels. Vacuum package areas 52 illustrate the areas between lid wafer 30 and device wafer 10 where a vacuum package exists. Within each vacuum package area 52 is one or more MEMS device 12. Probe channels 54 are preferably formed by sawing a channel through the lid wafer 30 over the previously etched bonding pad channels 36. Probe channels 54 may also be formed by an etching process or other suitable technique.

After probe channels 54 are formed in the lid wafer 30, bonding pads 14 are exposed. Bonding pads 14 can then be used to test each individual vacuum packaged MEMS device 12 on device wafer 10 using traditional integrated circuit bulk testing procedures which include probing each bonding pad 14. An important advantage of the present invention is that the vacuum packaged MEMS devices 12 may be tested at the wafer level thus minimizing the cost of verifying the operational integrity of each individual vacuum packaged MEMS device 12.

After testing the MEMS devices 12, the device wafer 10 is diced by sawing through probe channels 54 between bonding pads 14. In addition, a dicing saw is run between all vacuum package areas 52. The dicing of assembly 50 may be accomplished by using traditional methods of dicing silicon wafers with completed integrated circuits. By vacuum packaging MEMS devices 12 at the wafer level, traditional methods of handling integrated circuit devices may be used since the vacuum package provides protection to the delicate MEMS device 12.

The completed die representing a vacuum packaged MEMS device 12 may be mounted by chip-on-board methods or injection molded into a plastic package. In addition, the completed die may be placed in a non-vacuum package with other components.

Figure 12:
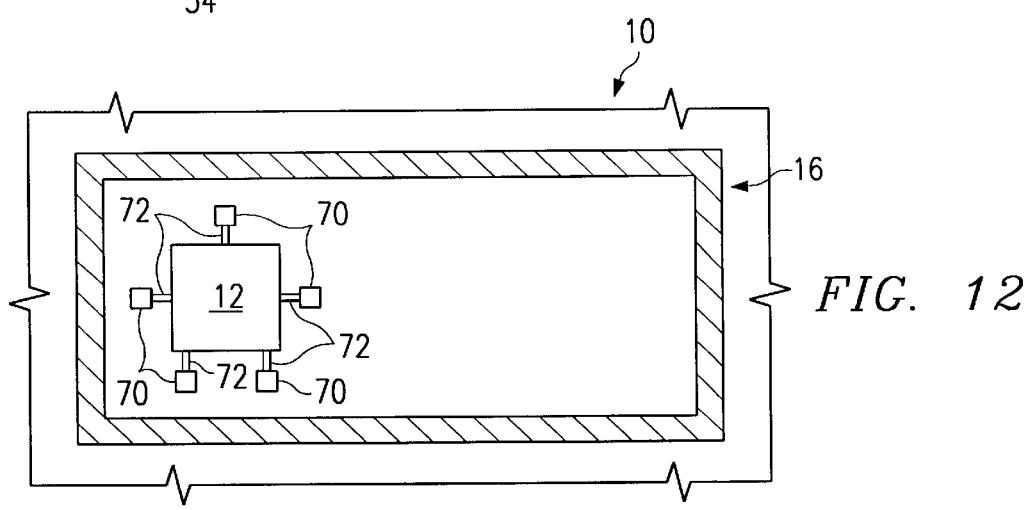
FIG. 12 is a schematic diagram of MEMS devices prepared for mating with another integrated circuit device.
Figure 13:
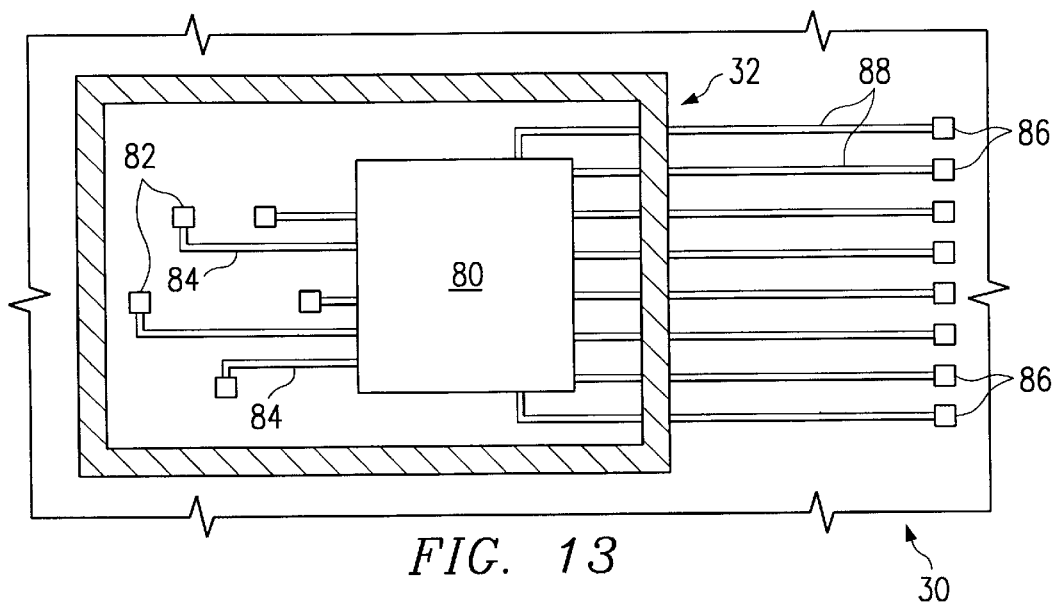
FIG. 13 is a schematic diagram of a semiconductor device prepared for mating with a MEMS device.

FIG. 12 and FIG. 13 illustrate an alternate embodiment of the present invention that enables a device wafer with MEMS devices to be mated with a lid wafer containing other semiconductor devices. After fabrication of a Complementary Metal Oxide Semiconductor (CMOS), the CMOS circuitry generally cannot be exposed to temperatures above approximately 400° C. This temperature limitation may exist for certain other integrated circuit (IC) devices. Typical MEMS fabrication techniques often use temperatures in excess of 400° C. Thus, when fabricating MEMS devices on a wafer with CMOS devices, the available MEMS fabrication techniques are severely limited. One solution to this problem is to separately fabricate the MEMS device and the CMOS device so that the CMOS device is not exposed to temperatures above 400° C. A MEMS die and a CMOS die are then placed in a package and electrically connected. This process requires expensive individual die handling.

In an alternate embodiment of the present invention, MEMS devices are fabricated on a device wafer and the CMOS devices are fabricated on a lid wafer. These wafers are then vacuum sealed together to produce a wafer with many vacuum packaged MEMS/CMOS devices. One of the advantages of the alternate embodiment is that MEMS devices are produced without processing limitations. Another advantage is that wafer losses in MEMS device fabrication do not result in the loss of a fully fabricated IC wafer. Since the alternate embodiment uses CMOS or other IC devices formed on a lid wafer, the alternate embodiment may not be suitable for use with MEMS devices requiring an optically transparent lid. An example of a MEMS device benefitting from the alternate process is a mechanical MEMS device connected to a CMOS or other IC device to form a complete, operating device. Although the alternate embodiment will be discussed with a single MEMS device 12 and a single CMOS device vacuum packaged together, one or more MEMS devices 12 and one or more CMOS devices could be incorporated into a single vacuum packaged die. In addition, wafer fabrication design may not require every MEMS device to be packaged with a CMOS device. For instance, one-half of the resulting dies may be MEMS only vacuum packaged devices and the other half may be MEMS/CMOS vacuum packaged devices.

Referring to FIG. 12, there is illustrated a portion of device wafer 10 having a MEMS device 12. A typical device wafer 10 has many MEMS devices 12. One or more device mating pads 70 are coupled to MEMS device 12 through leads 72. Device mating pads 70 are used to provide an electrical connection between MEMS device 12 and a CMOS or other integrated circuit (IC) device on a lid wafer. Device mating pads 70 may be comprised of a solder adhesion surface as described with reference to bonding pads 14 and are located within the area bounded by device sealing ring 16 and, thus, within the resulting vacuum package. Device sealing ring 16 is prepared for mating with a lid sealing ring on a lid wafer 30 as previously described. Thus, device sealing ring 16 includes a solder adhesion surface deposited and formed thereon. Since the alternate embodiment does not utilize bonding pads coupled to MEMS device 12 for providing electrical connections to the completed vacuum packaged die, a dielectric layer is not necessary for device sealing ring 16. The area bounded by device sealing ring 16 represents the area inside a vacuum package. Note that empty space is left within the vacuum area to accommodate the CMOS or other IC device formed on lid wafer 30.

Referring to FIG. 13, there is illustrated a portion of lid wafer 30 with a CMOS or other IC device 80 formed thereon. Lid wafer 30 may have many CMOS devices 80. Lid sealing ring 32 defines the area for forming lid solder adhesion surface 38 as previously described. One or more lid mating pads 82 are fabricated on the lid wafer 30. These lid mating pads 82 are a mirror image of device mating pads 70 so that when the device wafer 10 and the lid wafer 30 are properly aligned, device mating pads 70 and lid mating pads 82 will make contact thus providing electrical connections between MEMS device 12 and CMOS device 80. Lid mating pads 82 are connected to CMOS device 80 through leads 84. As described with reference to bonding pads 14, the lid mating pads 82 are comprised of a solder adhesion surface. For each CMOS device 80 on lid wafer 30, one or more package bonding pads 86 are connected to CMOS device 80 through leads 88. Note that leads 88 pass under the lid sealing ring 32. As previously described with reference to device sealing rings 16, the lid sealing ring 32 has a layer of silicon dioxide providing electrical insulation between leads 88 and the solder seal ring formed by device sealing ring 16 and lid sealing ring 32. Package bonding pads 86 provide the electrical connections for the resulting vacuum packaged device. As previously described, lid sealing ring 32 includes a layer of solder deposited on a lid solder adhesion surface. However, the solder layer could be deposited on either the properly prepared device sealing ring 16 or the properly prepared lid sealing ring 32.

A solder layer is also deposited on either device mating pads 70 or lid mating pads 82 so that a permanent electrical connection is made when device wafer 10 is mated with lid wafer 30. The solder may be any suitable metal or metal alloy. A lower vacuum in vacuum packaged MEMS device 12 may be expected for solder with a higher melting point since a more complete outgassing of package surface areas will occur. The vacuum within vacuum packaged MEMS device 12 is enhanced in the case of a solder with a low melting point by applying the solder to the lid wafer 30 and heating the device wafer 10 separately to a higher temperature than the solder melting point so as to obtain a more complete surface outgassing of device wafer 10. The desired vacuum level within the completed vacuum packaged MEMS device 12 and the temperature tolerance of lid wafer 30 determine the type of solder to be used, the furnace temperatures, and the furnace vacuum level.

After MEMS devices 12 are fabricated on device wafer 10 and CMOS devices 80 are fabricated on lid wafer 30, the lid wafer is placed in an assembly holder and device wafer 10 is aligned over the lid wafer. If the mating process utilizes a furnace temperature that will not damage CMOS devices 80 on lid wafer 30, the device wafer 10 and lid wafer 30 assembly are mated using the previously described process. If a furnace temperature will be utilized that may damage CMOS devices 80 on lid wafer 30, device wafer 10 may be separately heated. Device wafer 10 is then brought into alignment with lid wafer 30 followed by contacting the two wafers in a vacuum environment to produce vacuum packaged MEMS devices 12. After the completed assembly is cooled, probe access channels are opened above package bonding pads 86 to allow testing of vacuum packaged MEMS devices 12 utilizing bulk IC testing procedures. After all dies on the completed assembly are tested, the completed assembly is diced into individual dies.

As in the preferred embodiment, if higher vacuum levels are required in vacuum packaged MEMS device 12, an area in device wafer 10 is etched to provide a cavity to increase the surface-to-volume ratio of the resulting vacuum package.

Figure 14:
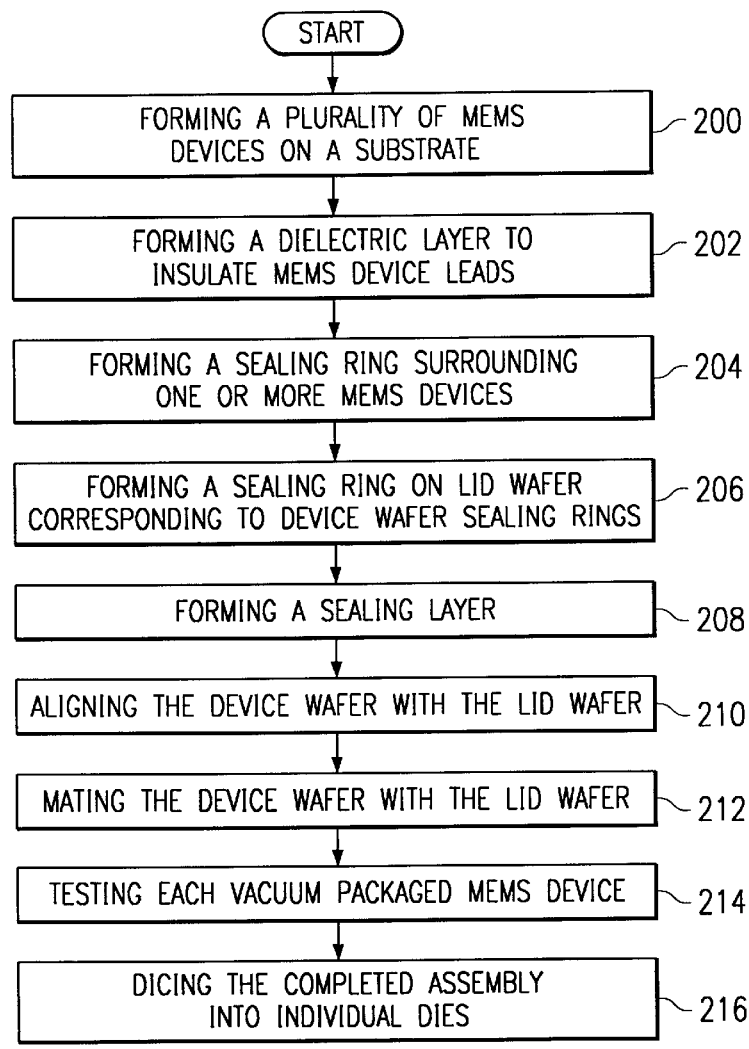
FIG. 14 is a flow chart illustrating the basic steps involved in wafer level vacuum packaging of MEMS devices.

Referring to FIG. 14, a flow chart illustrates the steps involved in vacuum packaging integrated circuit components during fabrication. At step 200, a plurality of MEMS devices 12 is formed on device wafer 10. The method then proceeds to step 202 where a dielectric layer 22 is formed between the perimeter of each MEMS device 12 and associated bonding pads 14. Dielectric layer 22 forms a continuous ring surrounding MEMS device 12. A dielectric layer inherent in the structure of the MEMS device 12 may also be used. The method then proceeds to step 204 where a sealing ring is formed on dielectric layer 22. Sealing ring 16 may include a lid solder adhesion surface to facilitate the mating of the device wafer 10 with a lid wafer 30 using a heat activated solder. The method then proceeds to step 206 where a plurality of lid sealing rings 32 is formed corresponding in location and number to device sealing rings 16. The method then proceeds to step 208 where a sealing layer is formed on each lid sealing ring 32. The sealing layer may be comprised of a heat activated solder, but may be composed of any appropriate sealing material. If MEMS device 12 has a support layer to protect any moving portions of MEMS device 12, the support layer is removed using an appropriate process, such as an etch process, prior to proceeding to step 210.

The method then proceeds to step 210 where the device wafer 10 is aligned with the lid wafer 30. After alignment, each device sealing ring 16 is aligned with its corresponding lid sealing ring 32. The method then proceeds to step 212 where the device wafer 10 is mated with the lid wafer 30 in a vacuum environment thus creating a plurality of vacuum packaged MEMS devices 12. The method then proceeds to step 214 where each vacuum packaged MEMS device 12 is tested using traditional integrated circuit testing procedures. In order to facilitate testing, probe access channels are opened above bonding pads 14 coupled to vacuum packaged MEMS devices 12. The method then proceeds to step 216 where the completed assembly 50 is diced using traditional integrated circuit dicing techniques.

Although the present invention has been described in detail, it should be understood that various changes, substitutions, and alterations may be made, without departing from the spirit and the scope of the present invention as defined by the claims.

What is claimed is:

1. A method for vacuum packaging integrated circuit devices, comprising:

forming on a device wafer a plurality of integrated circuit devices;

forming a plurality of first sealing rings, each of the plurality of first sealing rings surrounding one or more integrated circuit devices, each first sealing ring positioned between the perimeter of the one or more integrated circuit devices and one or more bonding pads coupled to each of the one or more integrated circuit devices;

forming on a lid wafer a plurality of second sealing rings corresponding in number and location to the plurality of first sealing rings;

forming a sealing layer on either each of the plurality of first sealing rings or each of the plurality of second sealing rings;

aligning the device wafer and the lid wafer such that each of the plurality of first sealing rings aligns with the corresponding one of the plurality of second sealing rings leaving a gap between the device wafer and the lid wafer; and mating the device wafer with the lid wafer in a vacuum environment to form a vacuum package within each of the plurality of first sealing rings and second sealing rings, each vacuum package enclosing one or more of the plurality of integrated circuit devices.

2. The method of claim 1, further comprising:

forming a plurality of cavities on the lid wafer, each of the plurality of cavities formed within and surrounded by one of the plurality of second sealing rings.

3. The method of claim 2, wherein forming a plurality of cavities comprises etching a plurality of pits in the lid wafer, each pit surrounded by one of the plurality of second sealing rings thereby leaving a cavity surrounded by one of the plurality of second sealing rings.

4. The method of claim 2, wherein forming a plurality of cavities comprises:

etching a plurality of holes in a window wafer corresponding to the plurality of integrated circuit devices; and bonding the window wafer to the lid wafer thereby creating a plurality of cavities corresponding to the plurality of integrated circuit devices.

5. The method of claim 1, wherein mating the device wafer with the lid wafer comprises:

placing the aligned device wafer and lid wafer in a vacuum chamber;

generating a vacuum within the vacuum chamber; and closing the gap between the device wafer and lid wafer thereby contacting the plurality of first sealing rings with the plurality of second sealing rings creating a plurality of vacuum packages, each vacuum package enclosing one or more of the plurality of integrated circuit devices.

6. The method of claim 1, wherein mating the device wafer with lid wafer comprises:

placing the aligned device wafer and lid wafer in a vacuum furnace;

generating a vacuum within the vacuum furnace;

outgassing surface areas of the device wafer and the lid wafer by heating the vacuum furnace to a temperature sufficient to outgas the surface areas;

closing the gap between the device wafer and lid wafer thereby contacting the plurality of first sealing rings with the plurality of second sealing rings creating a plurality of vacuum packages, each vacuum package enclosing one or more of the plurality of integrated circuit devices; and cooling the device wafer and lid wafer assembly after closing the gap at a rate determined to minimize subsequent outgassing of surfaces within the plurality of vacuum packages while minimizing thermal stresses on the plurality of vacuum packages.

7. The method of claim 1, wherein forming a sealing layer comprises forming an indium compression seal on each of the second sealing rings.

8. The method of claim 1, wherein forming a plurality of first sealing rings comprises first forming a plurality of dielectric layer rings, each of the plurality of dielectric layer rings surrounding one or more integrated circuit devices, each dielectric layer ring positioned between the perimeter of the one or more integrated circuit device and one or more bonding pads coupled to each of the one or more integrated circuit devices.

9. The method of claim 1, further comprising:

coating the inner surface of the lid wafer within each of the second sealing rings with an anti-reflective coating; and coating the outer surface of the lid wafer with an anti-reflective coating.

10. The method of claim 1, further comprising:

forming one or more spacers on the plurality of second sealing rings.

11. The method of claim 1, further comprising:

forming one or more bonding pad channels in the lid wafer corresponding in location to the bonding pads on the device wafer.

12. The method of claim 1, further comprising:

opening a plurality of probe access channels in the lid wafer following the formation of a plurality of vacuum packages, the plurality of probe access channels providing access to the bonding pads for testing of a plurality of vacuum packaged integrated circuit devices; testing each of the plurality of vacuum packaged integrated circuit devices by probing the bonding pads coupled to each integrated circuit device; and dicing the plurality of vacuum packaged integrated circuit devices following testing thereof.

13. A method for vacuum packaging integrated circuit devices, comprising:

forming on a device wafer a plurality of integrated circuit devices;

forming a plurality of first sealing rings, each of the plurality of first sealing rings surrounding one or more integrated circuit devices, each first sealing ring positioned between the perimeter of the one or more integrated circuit device and one or more bonding pads coupled to each of the one or more integrated circuit devices;

forming on a lid wafer a plurality of second sealing rings corresponding in number and location to the plurality of first sealing rings;

depositing a solder layer on either each of the plurality of first sealing rings or each of the plurality of second sealing rings;

aligning the device wafer and the lid wafer such that each of the plurality of first sealing rings aligns with the corresponding one of the plurality of second sealing rings leaving a gap between the device wafer and the lid wafer; and mating the device wafer with the lid wafer in a vacuum environment to form a plurality of vacuum packages, each vacuum package enclosing one or more of the plurality of integrated circuit devices.

14. The method of claim 13, further comprising:

heating the solder layer prior to mating the device wafer with the lid wafer.

15. The method of claim 13, wherein depositing a solder layer comprises positioning a preform solder pattern on the lid wafer in alignment with either the plurality of first sealing rings or the plurality of second sealing rings.

16. The method of claim 13, wherein depositing a solder layer comprises electroplating the lid wafer to deposit the solder layer.

17. The method of claim 13, wherein depositing a solder layer comprises vacuum deposition of the solder layer.

18. The method of claim 13, wherein depositing a solder layer comprises electroless plating.

19. A method for vacuum packaging integrated circuit devices, comprising:

forming on a device wafer a plurality of integrated circuit devices;

forming a plurality of first sealing rings, each of the plurality of first sealing rings surrounding one or more integrated circuit devices, each first sealing ring positioned between the perimeter of the one or more integrated circuit device and one or more bonding pads coupled to each of the one or more integrated circuit devices;

forming on a lid wafer a plurality of second sealing rings corresponding in number and location to the plurality of first sealing rings;

forming a solder layer on either each of the plurality of first sealing rings or each of the plurality of second sealing rings;

aligning the device wafer and the lid wafer such that each of the plurality of first sealing rings aligns with the corresponding one of the plurality of second sealing rings leaving a gap between the device wafer and the lid wafer; and mating the device wafer with the lid wafer in a vacuum environment to form a plurality of vacuum packages, each vacuum package enclosing one or more of the plurality of integrated circuit devices.

20. The method of claim 19, wherein forming a plurality of first sealing rings comprises forming a solder adhesion surface on each of the plurality of first sealing rings.

21. The method of claim 20, wherein forming a solder adhesion surface comprises:

depositing a layer of titanium;

depositing a layer of palladium on the layer of titanium; and depositing a layer of gold on the layer of palladium.

22. The method of claim 19, wherein forming a plurality of second sealing rings comprises forming on a lid wafer a plurality of solder adhesion surfaces corresponding in number and location to the plurality of first sealing rings.

23. The method of claim 22, wherein forming a plurality of solder adhesion surfaces comprises:

depositing a layer of titanium;

depositing a layer of palladium on the layer of titanium; and depositing a layer of gold on from the layer of palladium.

24. A method for vacuum packaging integrated circuit devices, comprising:

forming on a device wafer a plurality of integrated circuit devices;

forming a plurality of first sealing rings, each of the plurality of first sealing rings surrounding one or more integrated circuit devices, each first sealing ring positioned between the perimeter of the one or more integrated circuit devices and one or more bonding pads coupled to each of the one or more integrated circuit devices;

forming on a lid wafer a plurality of second sealing rings corresponding in number and location to the plurality of first sealing rings;

forming a sealing layer on either each of the plurality of first sealing rings or each of the plurality of second sealing rings;

aligning the device wafer and the lid wafer such that each of the plurality of first sealing rings aligns with the corresponding one of the plurality of second sealing rings leaving a gap between the device wafer and the lid wafer;

placing the aligned device wafer and lid wafer in a vacuum furnace leaving a gap between the device wafer and the lid wafer;

generating a vacuum within the vacuum furnace;

outgassing surface areas of the device wafer and the lid wafer by heating the vacuum furnace to a temperature sufficient to outgas the surface areas;

closing the gap between the device wafer and lid wafer thereby contacting the plurality of first sealing rings with the plurality of second sealing rings creating a plurality of vacuum packages, each vacuum package enclosing one or more of the plurality of integrated circuit devices; and cooling the device wafer and lid wafer assembly after closing the gap at a rate determined to minimize subsequent outgassing of surfaces within the plurality of vacuum packages while minimizing thermal stresses on the plurality of vacuum packages.

25. The method of claim 24 wherein forming a sealing layer comprises forming a compression seal on each of the second sealing rings.

26. The method of claim 24 further comprising:

forming one or more spacers on the plurality of second sealing rings.

27. The method of claim 24 further comprising:

forming one or more bonding pad channels in the lid wafer corresponding in location to the bonding pads on the device wafer.

28. A method for vacuum packaging integrated circuit devices, comprising:

forming on a device wafer a plurality of integrated circuit devices;

forming a plurality of first sealing rings, each of the plurality of first sealing rings surrounding one or more integrated circuit devices, each first sealing ring positioned between the perimeter of the one or more integrated circuit devices and one or more bonding pads coupled to each of the one or more integrated circuit devices;

forming on a lid wafer a plurality of second sealing rings corresponding in number and location to the plurality of first sealing rings;

forming a sealing layer on either each of the plurality of first sealing rings or each of the plurality of second sealing rings;

aligning the device wafer and the lid wafer such that each of the plurality of first sealing rings aligns with the corresponding one of the plurality of second sealing rings leaving a gap between the device wafer and the lid wafer;

placing the aligned device wafer and lid wafer in a vacuum chamber leaving the gap between the device wafer and the lid wafer;

generating a vacuum within the vacuum chamber; and closing the gap between the device wafer and lid wafer thereby contacting a plurality of first sealing rings with the plurality of second sealing rings creating a plurality of vacuum packages, each vacuum package enclosing one or more of the plurality of integrated circuit devices.

29. The method of claim 28 wherein forming a sealing layer comprises forming a compression seal on each of the second sealing rings.

30. The method of claim 28 further comprising:

forming one or more spacers on the plurality of second sealing rings.

31. The method of claim 28 further comprising:

forming one or more bonding pad channels in the lid wafer corresponding in location to the bonding pads on the device wafer.

\* \* \* \* \*

UNITED STATES PATENT AND TRADEMARK OFFICE
CERTIFICATE OF CORRECTION

PATENT NO.     : 6,521,477 B1
DATED          : February 18, 2003
INVENTOR(S)    : Roland W. Gooch et al.

Page 1 of 1

It is certified that error appears in the above-identified patent and that said Letters Patent is hereby corrected as shown below:

<u>Title page,</u>
Item [56], References Cited, U.S. PATENT DOCUMENTS, "Hegel, Jr. et al." reference, delete "250/378" and insert -- 250/578 --.

<u>Column 7,</u>
Line 21, after "280ºC" delete ".".

<u>Column 12,</u>
Line 61, after "wafer with" insert -- the --.

<u>Column 14,</u>
Line 67, after "gold on" delete "from".

Signed and Sealed this

Eleventh Day of May, 2004

JON W. DUDAS
*Acting Director of the United States Patent and Trademark Office*